United States Patent
Kuppuswamy (10) Patent No.: US 11,300,602 B1
(45) Date of Patent: Apr. 12, 2022

(54) METHOD FOR DETERMINING THE CONDITION OF ONE OR MORE ROTATING MACHINE ASSETS AND PROFILING THEIR MAINTENANCE NEEDS USING PARTIAL DISCHARGE MEASUREMENTS

(71) Applicant: Dynamic Ratings Pty. Ltd., Glen Waverley (AU)

(72) Inventor: Raja Kuppuswamy, Waukesha, WI (US)

(73) Assignee: Dynamic Ratings Pty. Ltd., Glen Waverley (AU)

( * ) Notice: Subject to any disclaimer, the term of this patent is extended or adjusted under 35 U.S.C. 154(b) by 0 days.

(21) Appl. No.: 17/132,214

(22) Filed: Dec. 23, 2020

Related U.S. Application Data (60) Provisional application No. 62/953,826, filed on Dec. 26, 2019.

(51) Int. Cl.
| | | |
|---|---|---|
| G01R 31/12 | (2020.01) | |
| G01R 31/34 | (2020.01) | |
| H02H 3/04 | (2006.01) | |
| H02H 7/09 | (2006.01) | |
| H02H 1/00 | (2006.01) | |
| H02H 7/06 | (2006.01) | |
| H02H 3/20 | (2006.01) | |

(52) U.S. Cl.
CPC ....... *G01R 31/1272* (2013.01); *G01R 31/343* (2013.01); *H02H 1/0015* (2013.01); *H02H 3/04* (2013.01); *H02H 3/20* (2013.01); *H02H 7/06* (2013.01); *H02H 7/09* (2013.01)

(58) Field of Classification Search
CPC .............. G01R 31/1272; G01R 31/343; H02H 1/0015; H02H 3/04; H02H 3/20
See application file for complete search history.

(56) References Cited

U.S. PATENT DOCUMENTS

| | | |
|---|---|---|
| 4,949,001 A | 8/1990 | Campbell |
| 6,285,538 B1 | 9/2001 | Krahn |
| 6,445,189 B1 * | 9/2002 | Pakonen ................ G01R 31/52 324/536 |
| 6,799,125 B2 | 9/2004 | Lau et al. |
| | (Continued) | |

OTHER PUBLICATIONS

Kuppuswamy, "Method to Profile the Maintenance Needs of a Fleet of Rotating Machine Assets using Partial Discharge Data", 2020 Electrical Insulation Conference (EIC), Virtual Event, Jun. 22-Jul. 3, 2020, 4 pages.

*Primary Examiner* — Scott Bauer
(74) *Attorney, Agent, or Firm* — Boyle Fredrickson S.C.

(57) ABSTRACT

A statistical method is described to interpret partial discharge (PD) measurement data from rotating machines for the maintenance personnel. Cumulative damage to the electrical insulation caused by PD during an observation time window is estimated using multiple PD sensors strategically distributed along the entire length of the machine winding. The damage thus estimated is compared against a reference value based on the annual averages of similar machines to determine if maintenance action is needed and how soon, if required. A method is also described to track the electrical insulation's overall condition and generate real-time health status alerts continuously and reliably.

21 Claims, 5 Drawing Sheets

(56) References Cited

U.S. PATENT DOCUMENTS

| | | | |
|---|---|---|---|
| 6,809,523 B1* | 10/2004 | Ahmed | H02H 1/0015 |
| | | | 324/520 |
| 2008/0088314 A1 | 4/2008 | Younsi et al. | |
| 2010/0066315 A1 | 3/2010 | Diatzikis et al. | |
| 2014/0320139 A1* | 10/2014 | Renforth | G01R 31/1263 |
| | | | 324/415 |
| 2016/0196375 A1* | 7/2016 | Nasle | G06F 17/10 |
| | | | 703/18 |
| 2018/0252760 A1* | 9/2018 | Andle | G01R 31/1227 |

* cited by examiner

|  | M1 | M15 | M23 | M32 | M46 | M55 | M56 | M68 | M81 |
|---|---|---|---|---|---|---|---|---|---|
| Q1 | 2.3 | 3.4 | 10.8 | 5.1 | 3.9 | 5.1 | 5.0 | 18.4 | 1.5 |
| Q2 | 2.4 | 3.5 | 11.2 | 5.2 | 4.1 | 5.1 | 5.2 | 19.1 | 1.6 |
| Q3 | 2.4 | 3.6 | 11.5 | 5.2 | 4.2 | 5.4 | 5.3 | 19.9 | 1.6 |
| Q4 | 2.5 | 3.6 | 11.8 | 5.3 | 4.3 | 5.5 | 5.4 | 20.5 | 1.6 |
| Surging | → | → | → | → | → | → | → | ↑ | → |

Fig. 5

METHOD FOR DETERMINING THE CONDITION OF ONE OR MORE ROTATING MACHINE ASSETS AND PROFILING THEIR MAINTENANCE NEEDS USING PARTIAL DISCHARGE MEASUREMENTS

CROSS-REFERENCE TO RELATED APPLICATIONS

This application claims priority to U.S. Provisional Patent Application Ser. No. 62/953,826, filed Dec. 26, 2019, the entirety of which is herein incorporated by reference.

FIELD OF THE DISCLOSURE

This disclosure relates generally to a method of determining the condition of insulation in an electrical asset. In particular, the disclosure is directed to a method of sensing and evaluating partial discharge to determine the condition of insulation in one or more rotational electrical assets and determining the maintenance needs thereof.

BACKGROUND OF THE INVENTION

A partial discharge (PD) is an electrical discharge or spark that bridges a small portion of the two conducting electrodes' insulation. Partial discharge can happen at any point in the insulation system, for example in a high voltage electrical asset, where the electric field strength exceeds the breakdown strength of that portion of the insulating material. Partial discharge can occur across the insulating material's surface (mainly due to contaminants or irregularities), within gas bubbles in liquid insulation, in voids within solid insulation, or around an electrode in gas.

Partial discharge activity provides evidence that an asset is deteriorating and very likely lead to future failure of the asset. The deterioration process can propagate and increase until the insulation can no longer withstand the electrical stress leading to flashover. The ultimate failure of electrical asset is often sudden and disastrous, leading to massive damage and network outages.

High voltage generators and motors are vital parts of power, generating plants, and industrial installations. They are long lead, high-cost items should they need to be replaced. An essential component of generators and motors is the stator. Stator winding insulation problems account for approximately 40% of all motor and generator forced outages, resulting in lost production and revenue for power generating and distribution systems.

The prior art methods utilize an on-line PD monitoring technique to identify deteriorated stator windings. The purpose of such a monitoring technique is to alert the asset owner of an abnormal situation that requires immediate attention or to identify developing problems in advance to take corrective actions in a planned and less disruptive manner.

Pre-existing methods for determining rotating machine health, such as a generator or motor stator, using partial discharge measurements, use PD sensors such as coupling capacitors and inductive high-frequency current transformers at the machine's stator terminals.

It is generally accepted within the industry that terminal PD measurements are less sensitive to identify electrical defects deep within the stator winding. Typically, on large machines, electrical defects beyond 10-15% from the stator winding line-end cannot be detected. That equates to the first 2 to 3 coils from the line-end. Therefore, other measures are necessary to expand the zone of defect detection.

Therefore, a need exists for a method to determine a machine's health by monitoring the PD occurring across the entire length of the stator winding. That is to say, sensing PD at multiple locations on the winding using multiple sensors to obtain a representative sampling of the PD activity.

Pre-existing PD monitoring systems typically use sensors with predetermined thresholds based on PD pulse magnitudes or its repetition rates or both at a given time to trigger a health status alert. However, this method is unreliable as metrics generated from such PD monitoring are susceptible to increases or decreases, or both, even when the electrical insulation is healthy. Even different experts on PD do not always agree on the critical and acceptable PD levels or even on the most significant parameters to use to characterize the PD activity. Further, interpretation of PD signals requires considerable knowledge of the stator winding construction, insulation design, signals propagation and attenuation, failure modes, and a good understanding of the measurement equipment.

Therefore, a need exists for an improved and reliable method to generate an alert indicative of a winding insulation problem. That includes generating an alert by combining information from multiple PD sensors distributed along the entire winding length, in the manner described, to establish a reliable alert.

Also, individuals who manage a fleet of electrical assets typically have a responsibility to maintain each asset's performance, including concerning PD. However, with limited resources available, such maintenance is generally accomplished by allocating resources only to the asset(s) that needs immediate attention and to delay or skip entirely care for the rest in the fleet. A standard way of doing that is by creating a shortlist of the worst-performing assets using predetermined criteria, such as given PD pulse magnitudes or repetition rates, or both. Asset owners may then run numerous diagnostic tests on each shortlisted asset and use subject matter experts' opinions to prioritize action, such as repair or replacement. Since standard PD metrics are susceptible to an erratic performance, using an unreliable metric to identify assets in the most need of repair or replacement may result in the wrong diagnosis and wastage of time and resources on assets needing less attention. Therefore, a need exists to provide a system that can better identify and profile a fleet's electrical assets' maintenance needs.

SUMMARY OF THE INVENTION

In one embodiment of the invention, a method for detecting partial discharge in a remote rotating electrical asset and determining a need for maintenance is provided. That includes the steps of providing a stator winding with a plurality of sensors configured to detect a partial discharge about the stator winding of the remote rotating electrical asset, and while the electrical asset is in use, first calculating a damaging power value from individual partial discharge events indicated by a signal received from each sensor within the plurality of sensors. Second, the method calculates an aggregate of damaging power values from the damaging power values at a plurality of points in time during an observation period. Third, the method calculates a severity index from the aggregate of destructive power values determined at a plurality of times during a time interval. The method then determines an alert status of the severity index relative to a reference distribution for the remote rotating electrical asset; and wherein the severity index exceeds a predetermined threshold as defined by the corresponding reference distribution, an alert indicating a need to provide maintenance to the remote rotating electrical asset is transmitted.

In another embodiment, the present invention provides a system for continuously and reliably managing a fleet or group of remote electrical assets using PD measurement data, a simple and scientific approach to identify the worst-performing assets in a fleet and profile its maintenance needs without needing a significant amount of details or resorting to additional offline testing or expert analysis.

BRIEF DESCRIPTION OF THE DRAWINGS

A clear conception of the advantages and features constituting the present invention will become more readily apparent by referring to the exemplary, and therefore non-limiting, embodiments illustrated in the drawings accompanying and forming a part of this specification, wherein like reference numerals designate the same elements in the several views.

In the drawings.

In describing the embodiments of the invention which are illustrated in the drawings, specific terminology will be resorted to for the sake of clarity. However, it is not intended that the invention be limited to particular terms so selected. It is to be understood that each specific term includes all technical equivalents that operate similarly to accomplish a similar purpose. For example, the words "connected," "attached," or terms similar thereto are often used. They are not limited to direct connection or attachment, but include connection or attachment to other elements where such connection or attachment is recognized as being equivalent by those skilled in the art.

DETAILED DESCRIPTION

Figure 1:
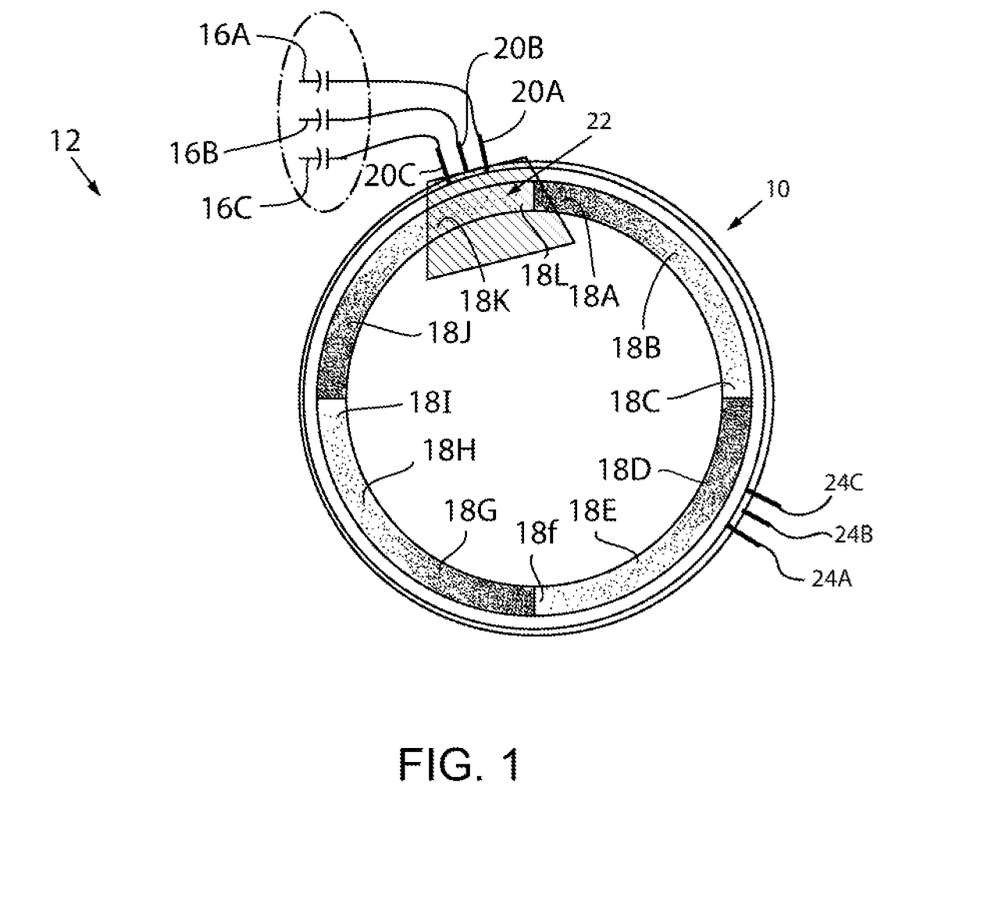
FIG. 1 is a schematic view of a stator winding of an electrical asset including multiple sensors for PD monitoring of the electrical insulation associated with the asset in accordance with one embodiment of the present invention.

Referring initially to FIG. 1, an exemplar stator winding 10 of a high voltage rotational electrical asset 12, such as a generator or motor, according to the present invention, is illustrated. The electrical asset can include multiple sensors 14 for PD monitoring of the electrical insulation "PD sensors"). For example, for a motor, sensors 14 for PD monitoring could comprise coupling capacitors ("CC") sensors 16 and/or resistance temperature detectors ("RTD") sensors 18 as shown.

CC sensors 16 are typically installed at the terminals 20 of the generator and motor. Generally, low capacitance coupling capacitor sensors 16, e.g., 80 pF, installed at the line terminals of an asset 12 will only have a zone of the sensitivity of 10-15% of the total stator winding 10. This equates to the first two or three coils on large motors and generators and maybe the first bar on large turbine generators. Accordingly, PD activity near the line terminals 18 is solely monitored with the rest of the winding (85 to 90%) unmonitored. As shown in FIG. 1, the area 22 corresponds to the zone of PD measurement sensitivity provided by the CC sensors 16.

To monitor the PD activity in areas uncovered by CC sensors 16, i.e., area of the stator winding 10 uncovered by area 22, temperature measurement RTD sensors 18 are used as antennas to capture high-frequency PD pulses for PD measurement. Most medium voltage machines have temperature measurement RTD sensors 18 embedded in the winding 10 during their manufacturing process. A typical generator or motor will have six (6) to twelve (12) RTD sensors 18. Many large generators will have as many as 60 RTD sensors 18. The exemplary asset 12, shown in FIG. 1, includes twelve (12) RTD sensors distributed around the 260 slots of the winding 10; namely: 18A located at slot 29, 18B located at slot 59, 18C located at slot 89, 18D located at slot 119, 18E located at slot 149, 18F located at slot 179, 18G located at slot 209, 18H located at slot 239, 18I located at slot 269, 18J located at slot 299, 18K located at slot 329 and 18L located at slot 359. The RTD sensors 18 act like an antenna or wireless PD sensor to capture high-frequency PD activity at different points along the stator winding 10, as shown in FIG. 1.

Accordingly, in combination, CC sensors 16 and RTD sensors 18 provide full coverage of PD activity throughout the stator winding 10. In a typical medium volt motor, three (3) CC sensors 16 at the line terminals and 6 RTD sensors 18 may be used to provide full coverage of the stator winding. More specifically, and as shown in FIG. 1, the three (3) CC sensors 16A-16C could correspond, for example, to one (1) sensor 16 at the line-terminal 20A-20C of each phase of the motor or generator's stator winding 10. The three neutral terminals 24A-C of the stator winding 10 may not include corresponding CC sensors. Moreover, in the embodiment having six (6) RTD sensors 18, the sensors 18 could correspond to two per phase and preferably located around 35% and 65% along each phase winding length.

System and Method to Manage a Fleet of Remote Electrical Assets Using PD Measurements Data.

Figure 2:
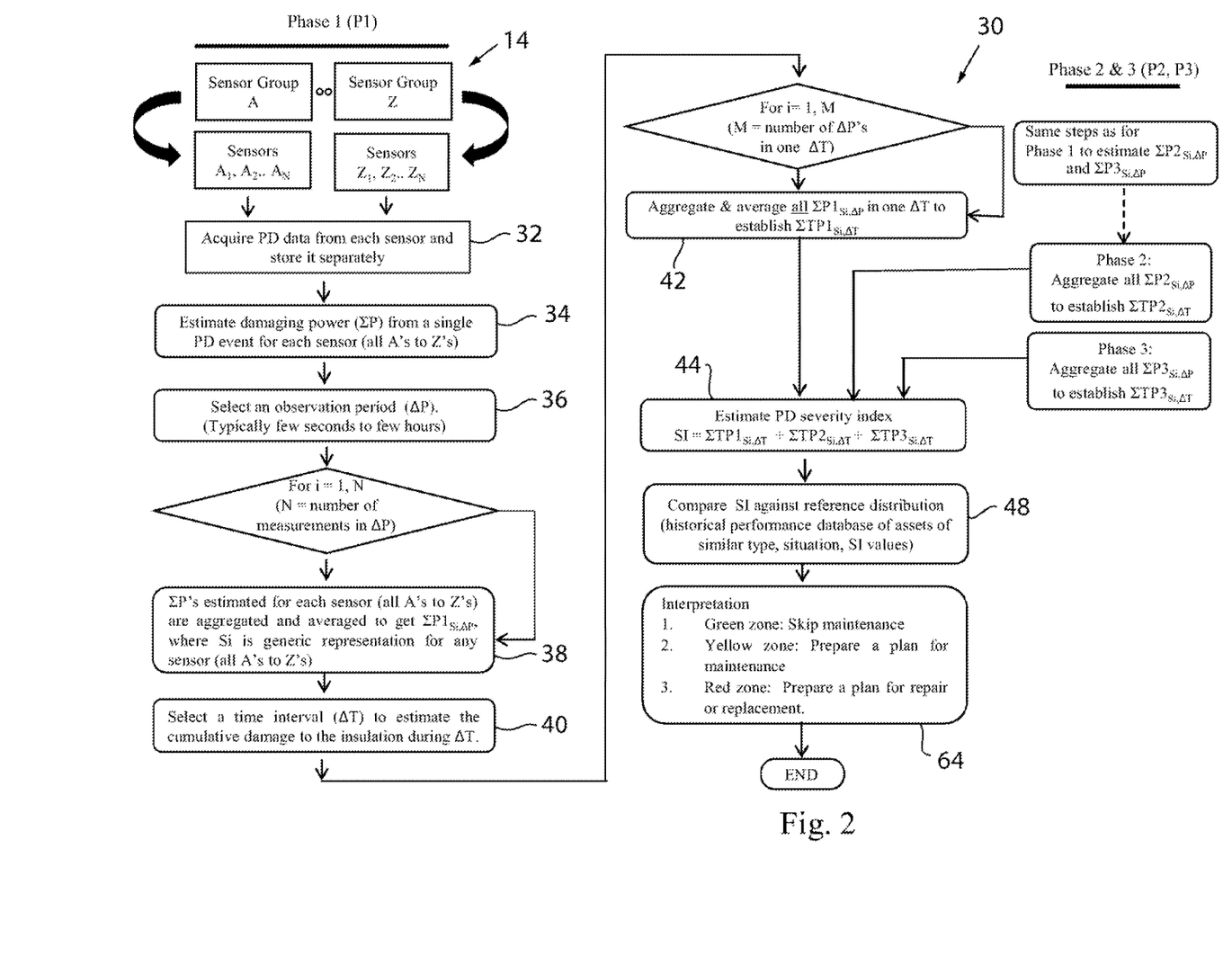
FIG. 2 is a first exemplary flow chart for providing a system for managing a fleet or group of remote electrical assets, such as that shown in FIG. 1, using PD measurement data provided in accordance with one embodiment of the present invention.

Referring now to FIG. 2, an exemplary flow chart for a method 30 of providing a system for managing a fleet or group of remote electrical assets 12 using PD measurement data is provided in accordance with an aspect of the invention. In this example, the electrical asset 12 could comprise a three-phase high voltage ("HV") motor, as previously described in FIG. 1. However, other types of electrical assets could similarly be used in other aspects of the invention, such as generators, including a mix of such assets.

The electrical asset 12 can include multiple sensors 14 for PD monitoring of the electrical insulation ("PD sensors"). For example, for a three-phase HV motor 12, sensors 14 for PD monitoring could comprise one or more coupling capacitor ("CC") sensors 16, or one or more resistance temperature detector ("RTD") sensors 18, or both arranged generally as described above. Such a combination of CC sensors 16 and RTD sensors 18 provides improved PD sensors coverage for the entire winding 10, as compared to the use of one type of sensor 14. In one aspect, one CC sensor 16 and two RTD sensors 18 may be used per electrical phase of the three-phase electrical system, such that the asset includes at least three (3) CC sensors 16 and six (6) RTD sensors 18.

In an initial block 32. PD data can be collected from each PD sensor 14 during each sampling. Sampling can occur periodically, during intervals, such as once per hour. The duration between sampling times, which may be 60 seconds, may have shorter or longer intervals depending on the health status of the particular asset 12 being monitored.

At the subsequent block 34, a damaging power ("ΣP") from any single-point-in-time measurement by a sensor can be estimated using Equation 1 below.

$$\sum P = \frac{1}{T}\sum_{i=1}^{i=n} Vi * Vr * S \qquad \text{(Equation 1)}$$

Where,
Vi is a measure of PD pulse amplitude which could be measured in milli-volts;
Vr is the voltage on the terminals of the electrical asset;
T is sampling time, measured in seconds; and
S is a scaling factor whose value can range, for example, between 1 to 10, depending on the specific sensor type's relative sensitivity to PD detection.

A sliding observation period ("ΔP"), which could range, for example, from seconds to hours, is selected at block 36 and can be applied to the damaging power. By way of a non-limiting example, an observation period of 1 week or 168 hours may be selected at box 36. Accordingly, PD data can be sampled every interval, such as every hour, during the observation period, with each sensor 14 making 168 single-point-in-time measurements during the observation period. Such an example would result in 168 ΣP damaging power determinations per Equation 1.

At the end of the observation period, for each individual sensor 14, all ΣP's from the observation period can be aggregated and averaged individually in block 38. For anyone voltage-phase, such as a first electrical phase "P1" of the three-phase electrical system, this can result in $\Sigma P1_{Si,\Delta P}$, with "Si" being a generic representation for all sensors under anyone voltage-phase.

Next, in a second stage of analysis, at block 40, a time interval ("ΔT") may be determined. Such determination can be based on experiential evidence that by analyzing PD data during this time interval, a value estimate on the health of the monitored asset 12 can be determined. By way of non-limiting example, a time interval of 12 weeks may be used for an observation period (ΔP) of 1 week and a time interval (ΔT) of 12 weeks, twelve $\Sigma P1_{Si,\Delta P}$ determinations can result, which determinations can then be grouped and averaged. That results in $\Sigma TP1_{Si,\ \Delta T}$ which represents cumulative damage caused by PD activity in the first electrical phase (P1) over the selected time interval (ΔT), calculated at block 42 of method 30.

The aforementioned first and second stages of method 30 can similarly be obtained or repeated for the system's remaining voltage-phases. For example, for the second and third electrical phases "P2" and "P3," a determination $\Sigma TP2_{Si,\ \Delta T}$ for the second electrical phases P2 and a determination $\Sigma TP3_{Si,\ \Delta T}$ for the third electrical phases P3, respectively, can be made. All such estimates, three in this case for the three phases, can be aggregated to calculate a PD severity index ("SI") using Equation 2, shown below at block 44.

$$SI = \Sigma TP1_{Si,\Delta T} + \Sigma TP2_{Si,\Delta T} + \Sigma TP3_{Si,\Delta T} \qquad \text{(Equation 2)}$$

While the proceeding stage of the method 30 describes the aggregation of determinations for all three phases of a three-phase electrical asset 12, to calculate a PD severity index, it should be understood that tracking the conditions of only a single-phase within an asset 12 is considered well within the scope of the present invention, and may allow for tracking the condition of one or more defective windings in an asset 12.

Next, in a third stage of the method 30, the severity index SI can be compared against a reference distribution 46 at block 48. The reference distribution 46 may be based on historical averages of severity index of a large population of similar assets 12 with known repair or failure or both histories.

Figure 3:
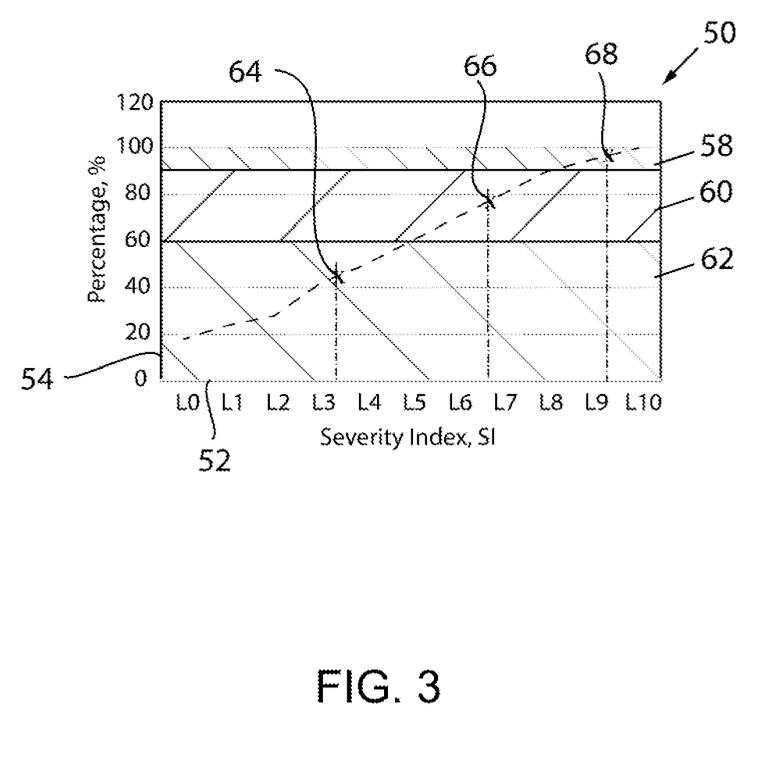
FIG. 3 is a graphical representation of the relative severity of required maintenance action needed, generated in accordance with a system for managing a fleet or group of remote electrical assets using PD measurement data in accordance with at least one embodiment of the present invention FIG. 4 a second exemplary flow chart for providing a system for managing a fleet or group of remote electrical assets, such as that shown in FIG. 1, using PD measurement data is provided in accordance with another embodiment of the present invention; and, FIG. 5 is a fleet condition heat map generated in accordance with a system for managing a fleet or group of remote electrical assets using PD measurement data in accordance with at least one embodiment of the present invention.
Figure 5:
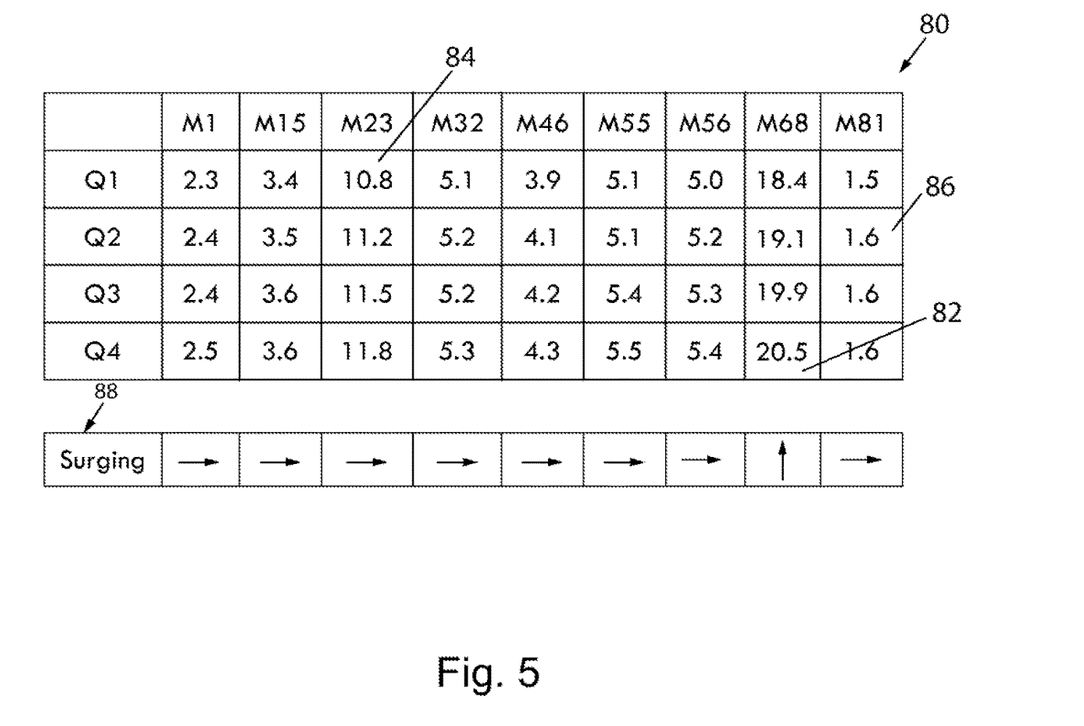

In one embodiment, the reference distribution 46 may be represented graphically, such as in graphic visualization 50 shown in FIG. 3 wherein the x-axis 52 represents the severity index ranked on a scale of 1 to 10, and the y-axis 54 represents the cumulative probability distribution in the percentage of a large population of assets 12. As previously described, the large population of assets 12 may be grouped based on one or more of the following criteria: machine ratings; years in service; operating conditions like start, stop, running hours, shutdown period; or maintenance history. Line 53 in FIG. 5 represents the reference distribution 46.

Graphic visualization 50 may have three zones that are each indicative of different maintenance conditions, such as a high priority zone 58 (red status), an intermediate priority zone 60 (yellow level), and a low priority zone 62 (green status). By way of example, a group of assets 12 having a SI value 64 within zone 562 would be assigned a relatively low maintenance priority; a group of assets 12 having a SI value 66 within zone 60 would be assigned a relatively mid-level maintenance priority; and, a group of assets 12 having a SI value 668 within zone 58 would be assigned a relatively high maintenance priority.

If a reference distribution 46 is unavailable, the reference distribution 46 shall be established according to Equation 3, shown below.

Reference $$\sum P = \frac{1}{N}\sum_{i=1}^{i=N}\left\{\frac{1}{x}\sum_{i=1}^{i=n}\sum P\frac{n}{i} + \frac{1}{y}\sum_{i=1}^{m}\sum P\frac{m}{i}\right\} \qquad \text{(Equation 3)}$$

Reference ΣP for machine #M was established by aggregating and averaging all single point in time PD measurements for CC sensors 16 and RTD sensors 18 for one year (N measurements).
Where:

$$\sum P \frac{n \ or \ m}{i}$$

Damaging power of PD obtained for measurement #i from PD sensor #n or #m. Terms n or m refers to two different types of PD sensors.

i—refers to the measurement number during the averaging period—one year is used for the reference distribution.

Scaling factors 1/x and 1/y correspond to the two PD sensor types—Coupling Capacitors and RTD PD sensors. This approach can be extended to any variety or combination of PD sensors.

Reference distribution 46 is the cumulative probability distribution of a group of machines, and the machines in the group can be based on one or more of the following criterion—machine ratings; years in service; operating conditions like start, stop, running hours, shutdown period; the history of maintenance, etc.

Accordingly, the present invention can provide a tool that provides a quick and usable result for effectively managing a fleet or group of remote electrical assets 12 using PD measurement data. In final block 64, the reference distribution graphic visualization 50 is interpreted. Accordingly, if a given electrical asset 12, such as the above mentioned HV motor, or group thereof, is determined to be in the high priority zone 58, an alert indicating immediate attention can be sent due to assets 12 in this zone historically having a high failure or repair rate. Similarly, if a given electrical asset 12 is determined to be more toward the middle of the distribution or lower-half, such as in the low priority zone 62, then an alert can be avoided (no alert sent), allowing the asset owner to skip maintenance of such asset 12.

However, if a given electrical asset is determined to be in the intermediate priority zone 60, an alert indicating maintenance can be queued for being sent at a later time, or a lower priority alert can be sent indicating suggested maintenance in the future. This can advantageously provide an effective way for asset owners to determine which electrical asset 12 should be allocated more resources/funds and which electrical assets might require less, without requiring a significant amount of details.

Figure 4:
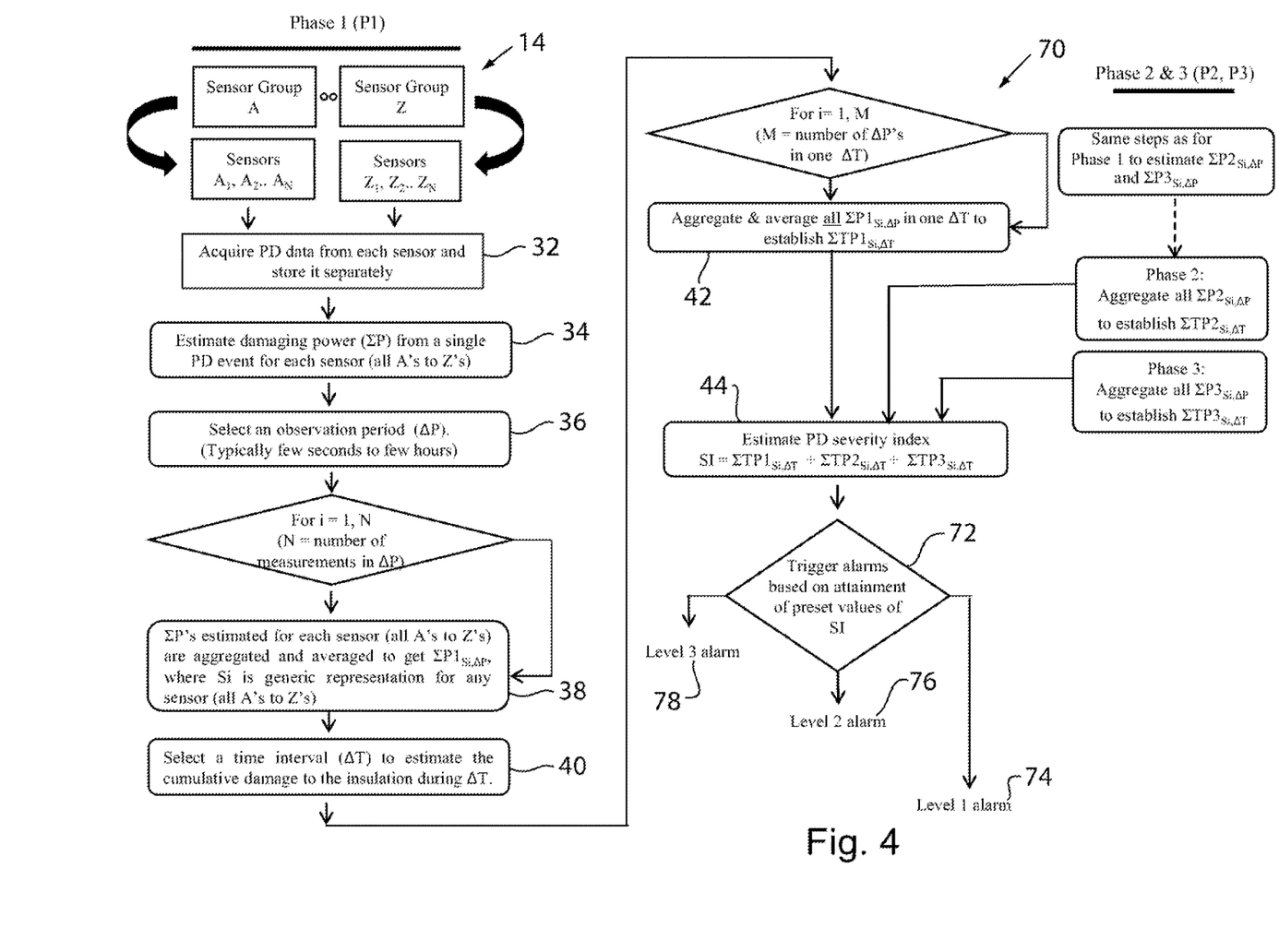

Turning now to FIG. 4, an alternative embodiment of an exemplary flow chart for a method 70 of providing a system for managing a fleet or group of remote electrical assets 12 using PD measurement data is provided in accordance with an aspect of the invention. In method 70, like reference numbers correspond to similar blocks of the method 30 as previously described and shown in FIG. 2.

More specifically, the method 70 corresponds to method 30 but for the absence of the third stage of the method 30, in which the severity index SI is compared against a reference distribution 46 at block 48 or subsequently interpreted at block 64.

Rather, method 70 continues by calculating a PD severity index ("SI") using Equation 2. It then proceeds directly to triggering an alarm based on attaining preset SI values, i.e., thresholds, at block 72. That is to say that if a given electrical asset 12, such as the aforementioned HV motor, or group thereof, is determined to be above a first threshold, which may correspond to a low priority zone 62, then a level 1 alarm 74 is triggered. Alternatively, if a given electrical asset 12 is determined to be above a second threshold, which may correspond to a mid-level priority zone 60, then a level 2 alarm 76 is triggered. Similarly, if a given electrical asset 12 is determined to be above a third threshold, which may correspond to a high-level priority zone 58, then a level 3 alarm 78 is triggered.

Turning now to FIG. 5, a fleet condition heat map 80 is shown in accordance with a system for managing a fleet or group of remote electrical assets 12 using PD measurement data in accordance with at least one embodiment of the present invention. More specifically, in accordance with method 70, as shown in FIG. 3, exemplary severity index data is collected from multiple assets 12 in the fleet at block 44. The various assets 12 within the group are identified at the top of each column in the heat map 40, and the severity index data for each asset 12 is listed in successive rows of the heat map 40, such that trends in the reported severity index data for each asset are readily apparent. In one embodiment, the severity index data that falls above the threshold to trigger a level 3 alarm 78 may have a first color 82, e.g., red; the severity index data that falls above the threshold to trigger a level 2 alarm 76 may have a second color 84, e.g., yellow, and the severity index data that falls above the threshold to trigger a level 1 alarm 74 may have a third color 86, e.g., green. In this manner, the heat map 80 coloring provides a visual indicia of different thresholds 41 to visually identify the health status of the asset 12. The heat map 80 may further provide an indication 88 as to the rate of deterioration in the asset 12, and whether the deterioration rate is flat, increasing, or decreasing. The rate of deterioration damage may be determined either using a simple mathematical expression to calculate the percentage increase in the severity index gathered between two time periods or by using a combination of other factors that influences the health of the asset 12.

Furthermore, the operational data for one or more assets 12 may be provided to an internet-connected software, such as a website or software as a service (SaaS) program with remote access for customers or users, including a status of the alert indicating the need to provide maintenance to the asset 12. Additional information may also be included in the internet-connected software, such as: the asset rating, actual usage of the asset, operational data collected during the actual usage of the asset, state of the asset health, recommended operating or maintenance actions indicative of a respective state of health of the asset. Use of the historical information provided by or to the internet-connected software may be utilized to develop a failure prediction for at least one of the pluralities of remote assets 12.

It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention.

I claim:

1. A method for detecting partial discharge in a remote rotating electrical asset and determining a need for maintenance thereof, the method comprising the steps of:

providing a stator winding having a plurality of sensors configured to detect a partial discharge about the stator winding of the remote rotating electrical asset;

while the electrical asset is in use, first calculating a damaging power value from individual partial discharge events indicated by a signal received from each sensor within the plurality of sensors;

second, calculating an aggregate of damaging power value from the damaging power values at a plurality of points in time during an observation period;

third, calculating a severity index from the aggregate of damaging power values determined at a plurality of times during a time interval;

determining an alert status of the severity index relative to a reference distribution for the remote rotating electrical asset; and, wherein when the severity index exceeds a predetermined threshold as defined by the corresponding reference distribution, transmitting an alert indicating a need to provide maintenance to the remote rotating electrical asset.

2. The method of claim 1, wherein the plurality of sensors are positioned at different locations on the stator winding and collectively provide a representative sampling of the partial discharge activity across an entirety of the stator winding.

3. The method of claim 2, wherein the plurality of sensors includes at least one or more of a first type of partial discharge sensor and at least one or more of a second type of partial discharge sensor.

4. The method of claim 3, wherein the first and second types of partial discharge sensors are selected from a group consisting of coupling capacitors, resistance-temperature-detectors, and inductive high frequency current transformers.

5. The method of claim 1, wherein the step of calculating a damaging power value from any single-point-in-time measurement by the sensor is calculated using the equation $$\sum P = \frac{1}{T} \sum_{i=1}^{i=n} Vi * Vr * S.$$

6. The method of claim 1, wherein the step of calculating a severity index is calculated using the equation $SI = \Sigma TP1_{Si, \Delta T} + \Sigma TP2_{Si, \Delta T} + \Sigma TP3_{Si, \Delta T}$.

7. The method of claim 1, wherein the reference distribution is calculated using the equation Reference $$\sum P = \frac{1}{N} \sum_{i=1}^{i=N} \left\{ \frac{1}{x} \sum_{i=1}^{i=n} \sum P \frac{n}{i} + \frac{1}{y} \sum_{i=1}^{m} \sum P \frac{m}{i} \right\}.$$

8. The method of claim 1, wherein the step of calculating the severity index is calculated for a single phase of a three-phase electrical system.

9. The method of claim 1, wherein the step of calculating the severity index is calculated for three phases of a three-phase electrical system.

10. The method of claim 1, wherein the observation period is at least 1 week, and wherein the time interval is at least 12 weeks.

11. The method of claim 1, wherein the predetermined threshold is indicative of an electrical asset maintenance priority category.

12. The method of claim 1, wherein the remote rotating electrical asset is a first asset in a plurality of assets in an electrical system.

13. The method of claim 12, wherein the plurality of assets are selected from a totality of assets in the electrical system as a group having one or more of a common asset characteristic selected from: machine rating; years in service; start operating condition; stop operating condition; running hours; and shutdown period.

14. The method of claim 1, wherein the step of transmitting the alert indicating the need to provide maintenance to the remote rotating electrical asset further comprises tripping a breaker or operating a relay to disconnect the electrical asset from an electrical system.

15. The method of claim 12, wherein the step of calculating the severity index further comprises calculating the severity index for each electrical asset in the plurality of assets; and, generating a visual output including the severity index for each electrical asset;

wherein the visual output further includes an indicia of the severity index relative to at least one predetermined threshold.

16. The method of claim 15, wherein the visual output is a heat map and the indicia of the severity index relative to at least one predetermined threshold comprises a color gradient.

17. The method of claim 15, wherein the visual output further comprises an indicator of a rate of deterioration of electrical insulation in the asset as determined by a percentage increase in the severity index between two time periods.

18. The method of claim 1, further comprising the step of generating a graphical visual output indicative of the alert relative to an electrical asset maintenance priority category defined by the predetermined threshold.

19. The method of claim 18, wherein the graphical visual output includes a scale of severity index disposed along an x-axis and a cumulative probability distribution in percentage along a y-axis.

20. The method of claim 1, further comprising the step of transmitting a status of the alert indicating the need to provide maintenance to the remote rotating electrical asset to a website containing operational data of the remote rotating electrical asset.

21. The method of claim 15, further comprising the step of displaying the visual output in an internet-connected software providing remote access to users.

* * * * *